United States Patent
Ting

(10) Patent No.: US 7,307,316 B2
(45) Date of Patent: Dec. 11, 2007

(54) THIN FILM TRANSISTOR

(75) Inventor: Chin-Kuo Ting, Gueishan Township, Taoyuan County (TW)

(73) Assignee: AU Optronics Corp., Hsinchu (TW)

( * ) Notice: Subject to any disclaimer, the term of this patent is extended or adjusted under 35 U.S.C. 154(b) by 150 days.

(21) Appl. No.: 11/220,276

(22) Filed: Sep. 6, 2005

(65) Prior Publication Data
US 2006/0157707 A1 Jul. 20, 2006

(30) Foreign Application Priority Data
Jan. 19, 2005 (TW) .............................. 94101526 A

(51) Int. Cl.
*H01L 29/76* (2006.01)
(52) U.S. Cl. ..................................... 257/336
(58) Field of Classification Search ................ 438/217, 438/149; 257/336
See application file for complete search history.

(56) References Cited

U.S. PATENT DOCUMENTS 6,486,014 B1 * 11/2002 Miyanaga et al. .......... 438/217
7,071,036 B2 * 7/2006 Yang .......................... 438/149

* cited by examiner

*Primary Examiner*—Michael Lebentritt
*Assistant Examiner*—Monica D. Harrison
(74) *Attorney, Agent, or Firm*—Thomas, Kayden, Horstemeyer & Risley

(57) ABSTRACT

A thin film transistor, comprising a first N-type LDD (Lightly Doped Drain) and a second N-type LDD, is provided. The two N-type LDDs are formed in a semiconductor layer by tilted implantation with a gate electrode serving as a mask. The two N-type LDDs are adjacent to source/drain regions, respectively. The thin film transistor further comprises a third P-type LDD and a fourth P-type LDD. The two P-type LDDs are formed in a semiconductor layer by tilted implantation with a gate electrode serving as a mask. The source/drain regions and the two N-type LDDs are surrounded by the two P-type LDDs, respectively.

6 Claims, 12 Drawing Sheets

THIN FILM TRANSISTOR

BACKGROUND

The present invention relates to a liquid crystal display device, and more particularly to a liquid crystal display device having lightly doped drains (LDDs).

To increase the aperture ratio of a low temperature liquid crystal display device, the channel length between the source/drain regions must be reduced. When channel length is reduced, however, short channels effect occurs. A hot electron effect also occurs when the device is driven by a voltage.

With a short channel, depletion regions between the source/drain regions become narrow when voltage is applied to the device. Meanwhile, leakage current between the source/drain electrodes occurs, and the punch-through effect intensifies. The electronic properties of a low temperature poly silicon liquid crystal display device are thus affected and the device may be unreliable.

In a typical process of fabricating a lightly doped drain, although the P-type LDDs surround the N-type LDDs, leakage current and punch-through effects still occur when a large voltage is applied to the device.

Accordingly, a liquid crystal display capable of ameliorating the described problems is desirable.

SUMMARY

The invention provides devices for solving problems such as hot electron and punch-through effects, as well as leakage current.

An object of the invention is to provide a liquid crystal display device having N-type LDDS.

Another object of the invention is to provide a liquid crystal display device having P-type LDDS surrounding N-type LDDS and source/drain regions.

In accordance with an aspect of the invention, a method of fabricating a liquid crystal display device is provided. Source/drain regions are formed by an ion implantation utilizing a gate electrode directly serving as a mask. Additionally, N-type lightly doped drains and P-type lightly doped drains are formed by tilted ion implantations, respectively. By changing the implant angles and proper selection of doping energy and dosage, the location of lightly doped drains is changed. Buried LDDs, for example, may be formed in this manner.

A detailed description is given in the following embodiments with reference to the accompanying drawings.

DESCRIPTION OF THE DRAWINGS

The invention can be more fully understood by reading the subsequent detailed description and examples with reference made to the accompanying drawings, wherein.

DETAILED DESCRIPTION

As shown in FIGS. 1 through 4, methods of fabricating P-type LDDs surrounding N-type LDDS and source/drain regions are provided to diminish the depletion area between source/drain regions, and to solve problems such as leakage current and punch-through effect.

FIGS. 1A to 1G are cross-sections of a method of fabricating a liquid crystal display device according to an embodiment of the present invention. The method comprises the following steps.

Figure 1A:
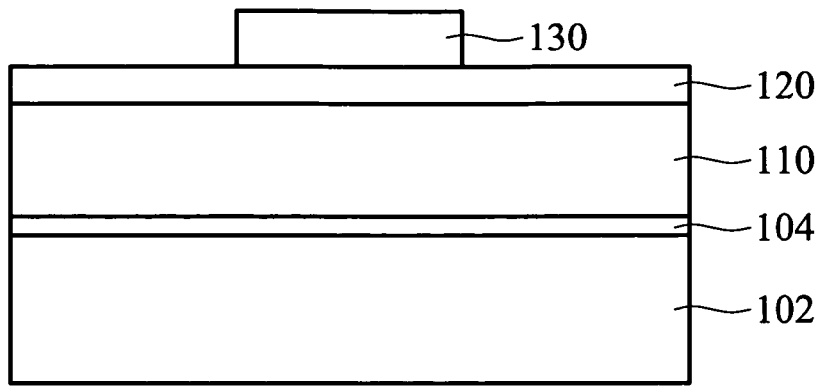
FIGS. 1A to 1G are cross-sections of a method of fabricating a liquid crystal display device having P-type LDDs according to an embodiment of the present invention.

As shown in FIG. 1A, a substrate 102 is provided followed by formation of a buffer layer 104 on the surface thereof. A semiconductor layer 110 is formed on the buffer layer 104 and a gate insulating layer 120 is formed on the semiconductor layer 110. Subsequently, a gate electrode 130 is formed on the gate insulating layer 120.

Figure 1B:
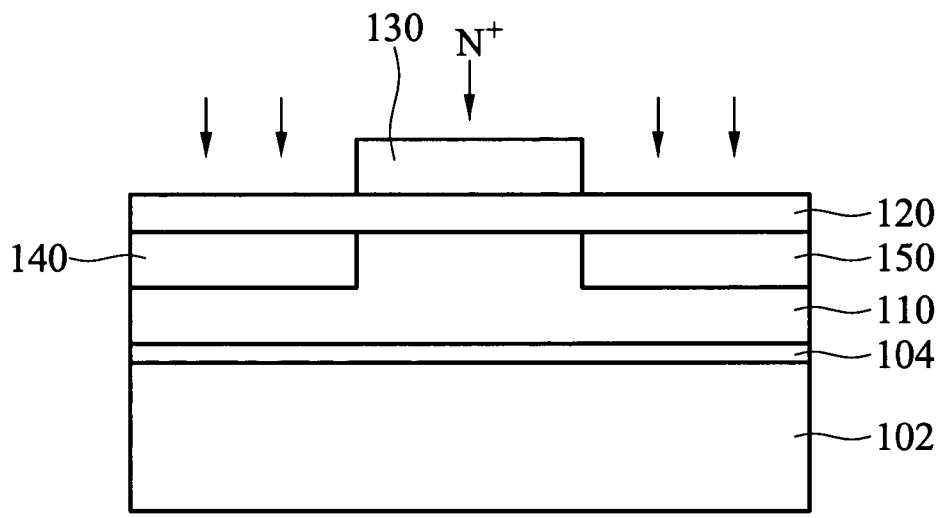

As shown in FIG. 1B, with the gate electrode 130 serving as a mask, an ion implantation is performed to implant an N-type dopant into the semiconductor layer 110, forming source/drain 140/150 regions. The N-type dopant may comprise As, P, $AsH_x$, or $PH_x$. The N-type dopant is implanted into the semiconductor layer 110 in a direction of substantially perpendicular to the surface of the substrate 102 at an energy of 10 to 20 keV with a dosage of $1*10^{15}$ to $5*10^{15}$ ions/cm$^2$.

Figure 1C:
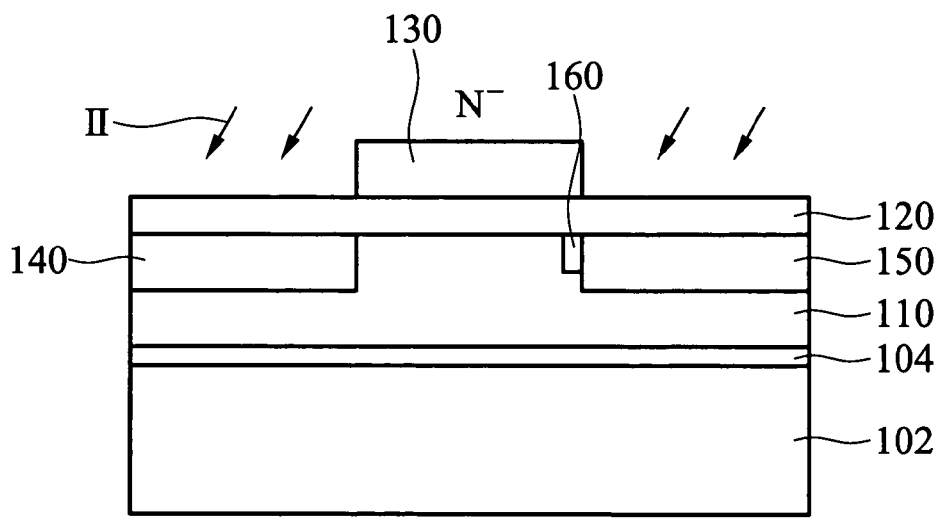
Figure 1D:
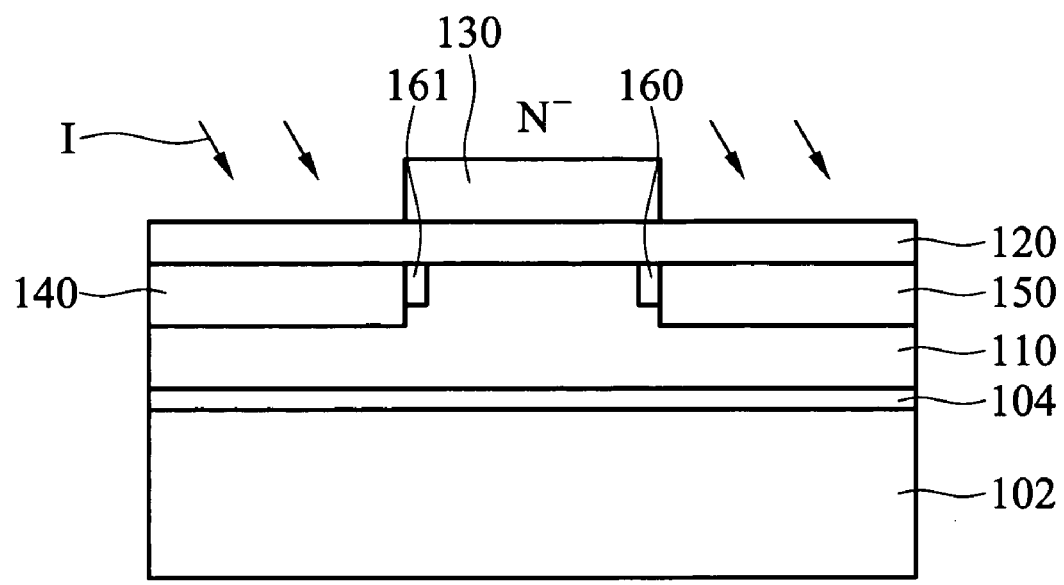

As shown in FIGS. 1C and 1D, with the gate electrode 130 serving as a mask, two tilted ion implantations are performed to implant an N-type dopant into the semiconductor layer 110 at angle II and angle I, respectively, to form N-type lightly doped regions partially overlapping the source/drain 140/150 regions. Two N-type LDDs 160 and 161 are formed below the gate insulating layer 120. The ion implantations are performed at an energy of 10 to 50 keV with a dosage of $5*10^{12}$ to $1*10^{14}$ ions/cm$^2$. The N-type dopant is implanted into the semiconductor layer 110 at angle II and angle I deviating from a normal line of the substrate 102 by between 40 and 80°, respectively. The N-type dopant may comprise As, P, $AsH_x$, or $PH_x$.

Figure 1E:
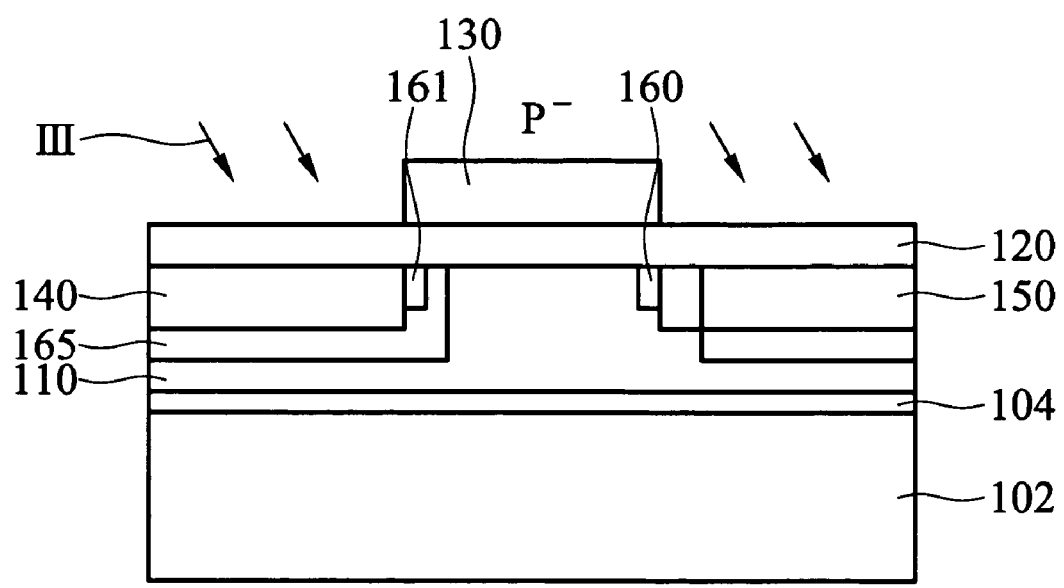
Figure 1F:
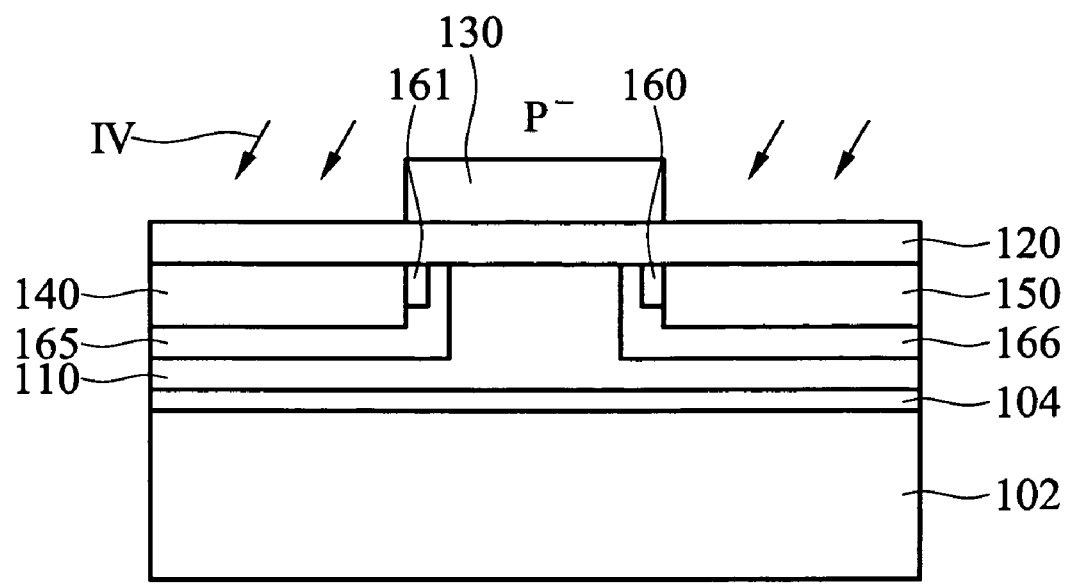

As shown in FIGS. 1E and 1F, with the gate electrode 130 serving as a mask, two tilted ion implantations are performed to implant a P-type dopant into the semiconductor layer 110 at angle III and angle IV, respectively, to form P-type lightly doped regions surrounding the source/drain 140/150 regions and the N-type LDDs 160 and 161. Two P-type LDDs 165 and 166 are formed. The ion implantations are performed at an energy of 40 to 80 keV with a dosage of $5*10^{11}$ to $2*10^{12}$ ions/cm$^2$. The P-type dopant is implanted into the semiconductor layer 110 at angle III and angle IV deviating from a normal line of the substrate 102 by between 40 and 60°, respectively. The P-type dopant may comprise B, $BH_x$, or $BF_x$.

Figure 1G:
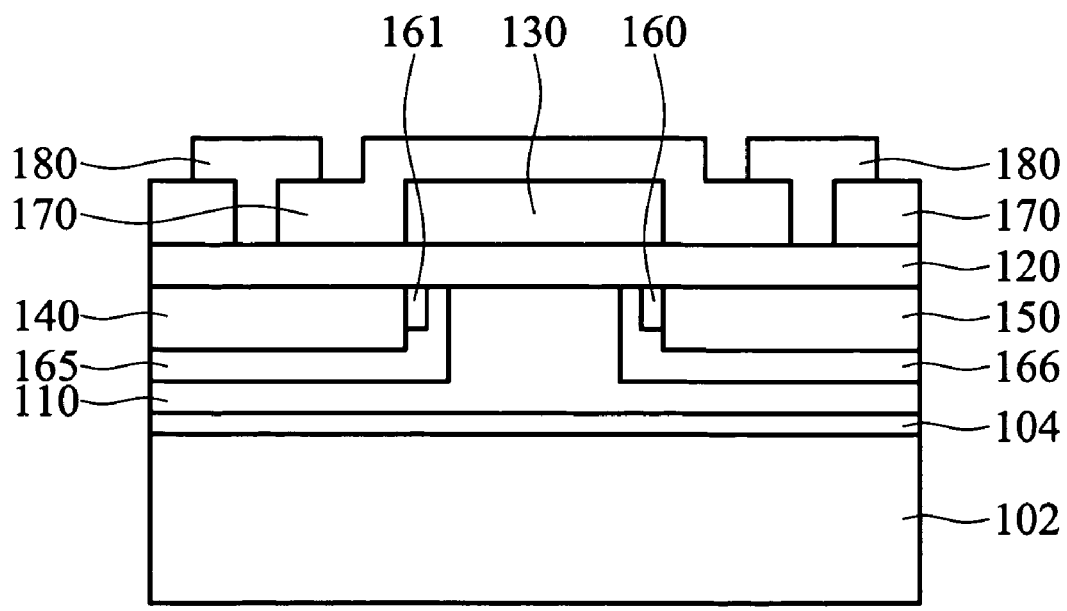

As shown in FIG. 1G, an interlayer dielectric layer 170 is formed on the gate electrode 130 and the surface of the substrate 102. A conductive line 180 is formed in the interlayer dielectric layer 170, contacting the source/drain 140/150 regions.

FIGS. 2A to 2G are cross-sections of a method of fabricating a liquid crystal display device according to an embodiment of the present invention. The method comprises the following steps.

Figure 2A:
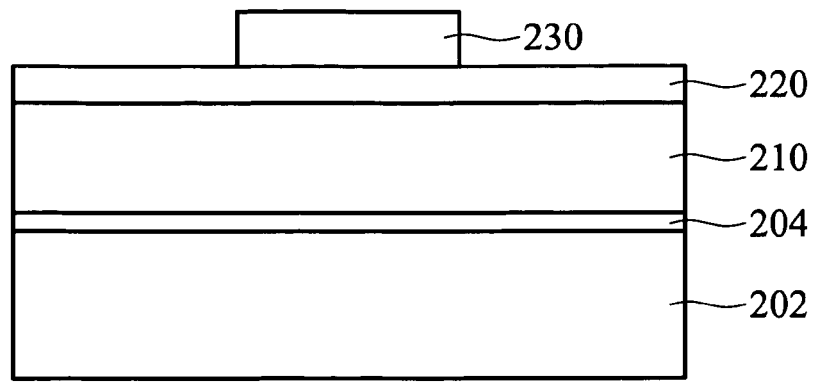
FIGS. 2A to 2G are cross-sections of a method of fabricating a liquid crystal display device having P-type LDDs according to another embodiment of the present invention.

As shown in FIG. 2A, a substrate 202 is provided followed by formation of a buffer layer 204 on the surface thereof. A semiconductor layer 210 is formed on the buffer layer 204 and a gate insulating layer 220 is formed on the semiconductor layer 210. Subsequently, a gate electrode 230 is formed on the gate insulating layer 220.

Figure 2B:
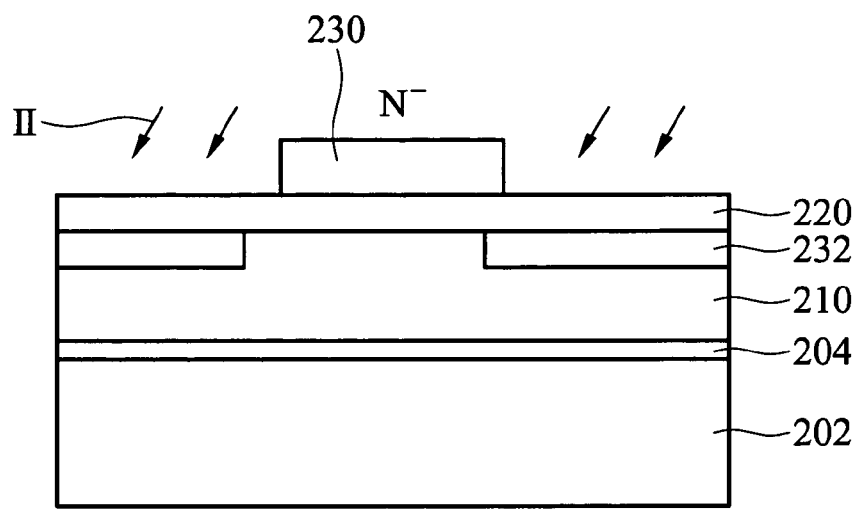
Figure 2C:
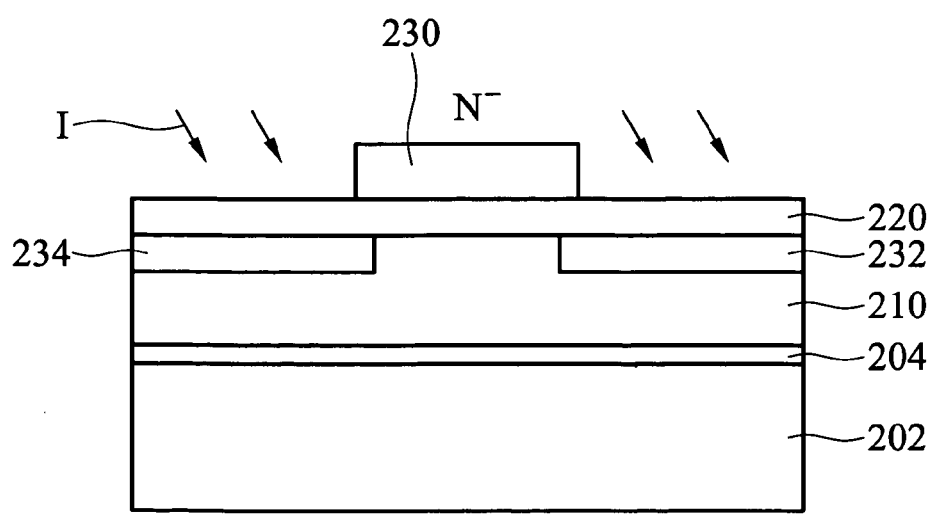

As shown in FIGS. 2B and 2C, with the gate electrode 230 serving as a mask, two tilted ion implantations are performed to implant an N-type dopant into the semiconductor layer 210 at angle II and angle I, respectively, to form N-type lightly doped regions 232 and 234. The ion implantations are performed at an energy of 10 to 50 keV with a dosage of $5*10^{12}$ to $1*10^{14}$ ions/cm$^2$. The N-type dopant is implanted into the semiconductor layer 210 at angle II and angle I deviating from a normal line of the substrate 202 by between 40 and 80°, respectively. The N-type dopants may comprise As, P, AsH$_x$, or PH$_x$.

Figure 2D:
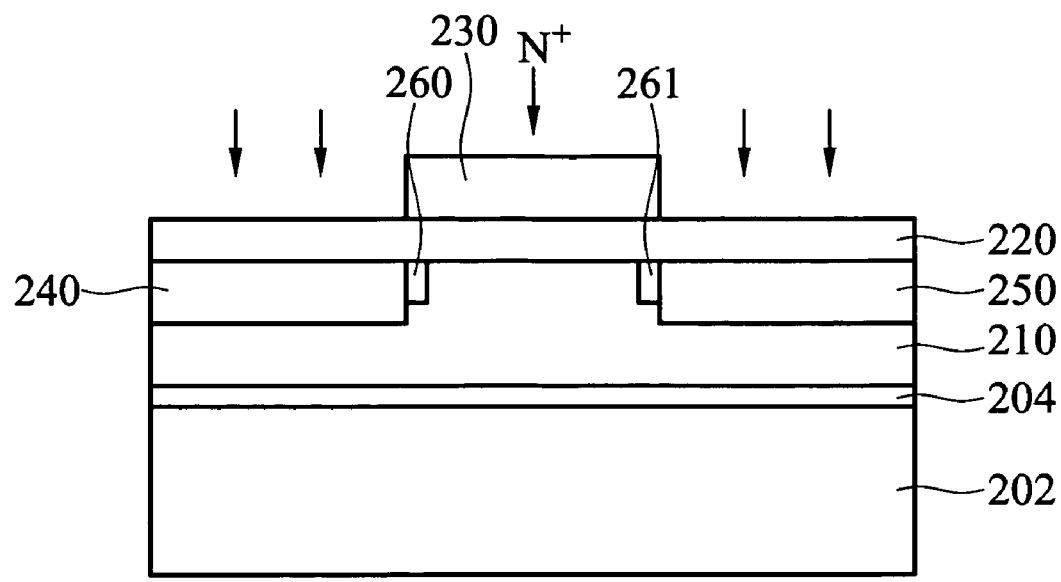

As shown in FIG. 2D, with the gate electrode 230 serving as a mask, an ion implantation is performed to implant an N-type dopant into the semiconductor layer 210, forming source/drain 240/250 regions partially overlapping the N-type lightly doped regions 232 and 234. Two N-type LDDs 260 and 261 are formed below the gate insulating layer 220. The N-type dopant may comprise As, P, AsH$_x$, or PH$_x$. The N-type dopant is implanted into the semiconductor layer 210 in a direction of substantially perpendicular to the surface of the substrate 202 at an energy of 10 to 20 keV with a dosage of $1*10^{15}$ to $5*10^{15}$ ions/cm$^2$.

Figure 2E:
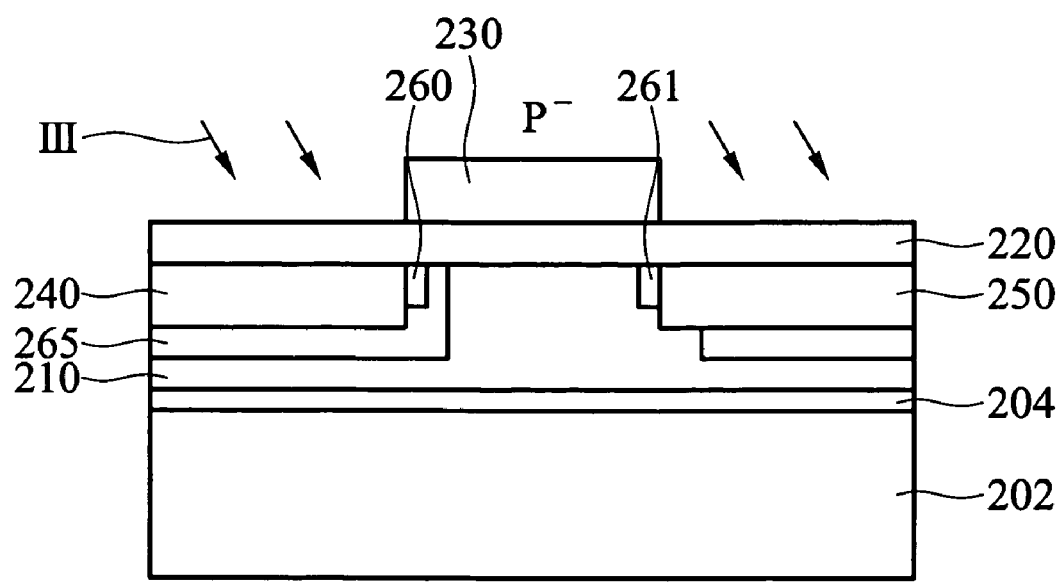
Figure 2F:
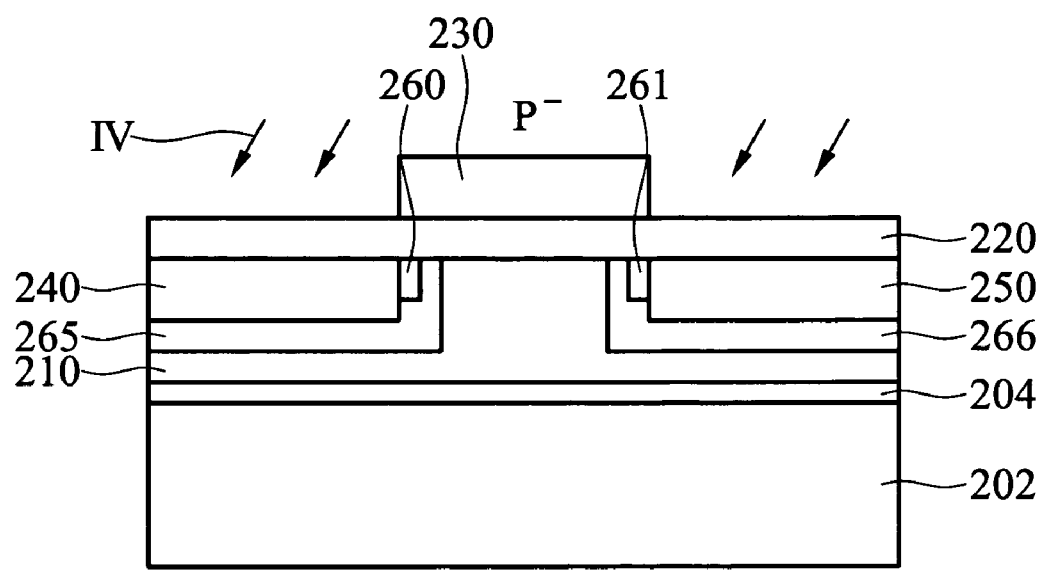

As shown in FIGS. 2E and 2F, with the gate electrode 230 serving as a mask, two tilted ion implantations are performed to implant a P-type dopant into the semiconductor layer 210 at angle III and angle IV, respectively, to form P-type lightly doped regions surrounding the source/drain 240/250 regions and the N-type LDDs 260 and 261. Two P-type LDDs 265 and 266 are formed. The ion implantations are performed at an energy of 40 to 80 keV with a dosage of $5*10^{11}$ to $2*10^{12}$ ions/cm$^2$. The P-type dopant is implanted into the semiconductor layer 210 at angle III and angle IV deviating from a normal line of the substrate 202 by between 40 and 60°, respectively. The P-type dopant may comprise B, BH$_x$, or BF$_x$.

Figure 2G:
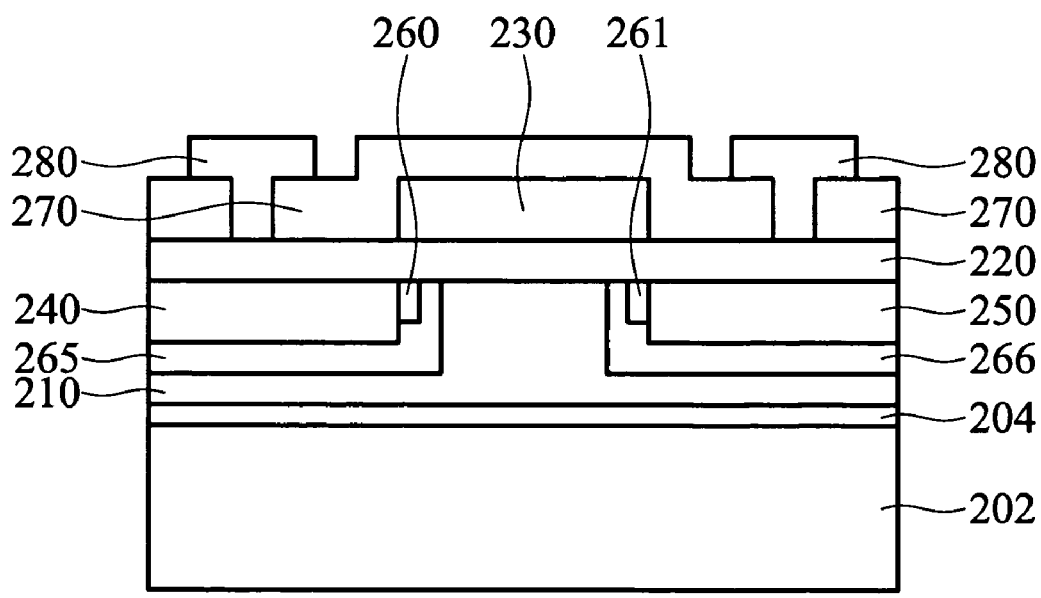

As shown in FIG. 2G, an interlayer dielectric layer 270 is formed on the gate electrode 230 and the surface of the substrate 202. A conductive line 280 is formed in the interlayer dielectric layer 270, contacting the source/drain 240/250 regions.

FIGS. 3A to 3G are cross-sections of a method of fabricating a liquid crystal display device according to an embodiment of the present invention. The method comprises the following steps.

Figure 3A:
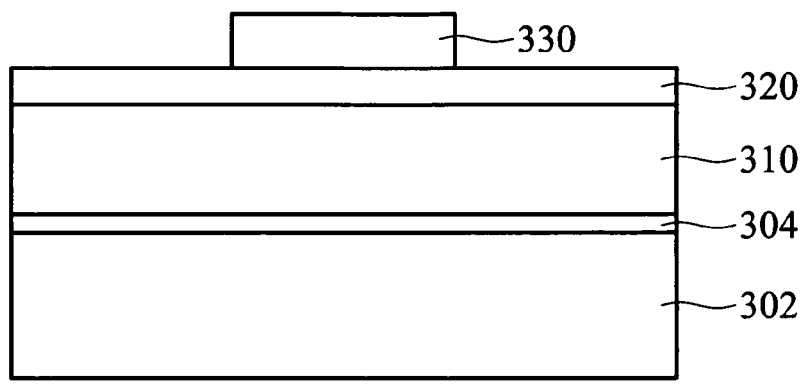
FIGS. 3A to 3G are cross-sections of a method of fabricating a liquid crystal display device having P-type LDDs according to another embodiment of the present invention.

As shown in FIG. 3A, a substrate 302 is provided followed by formation of a buffer layer 304 on the surface thereof. A semiconductor layer 310 is formed on the buffer layer 304 and a gate insulating layer 320 is formed on the semiconductor layer 310. Subsequently, a gate electrode 330 is formed on the gate insulating layer 320.

Figure 3B:
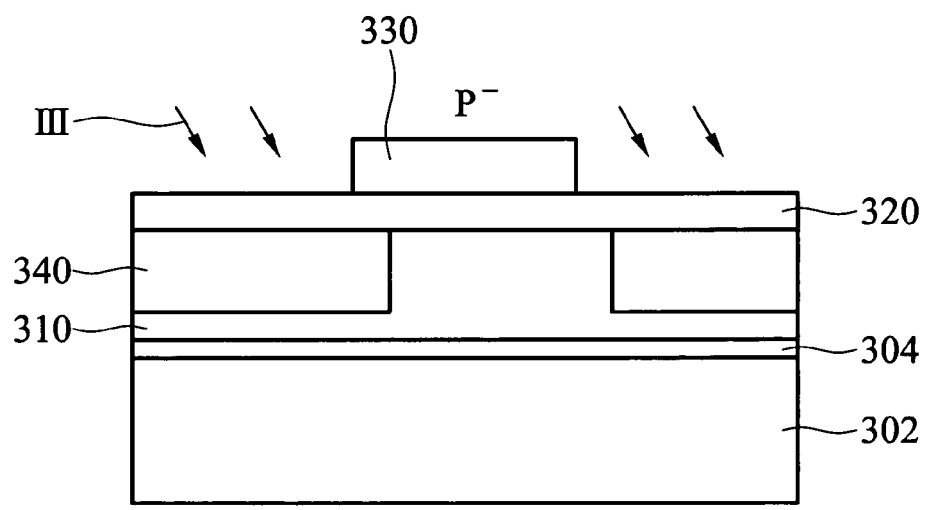
Figure 3C:
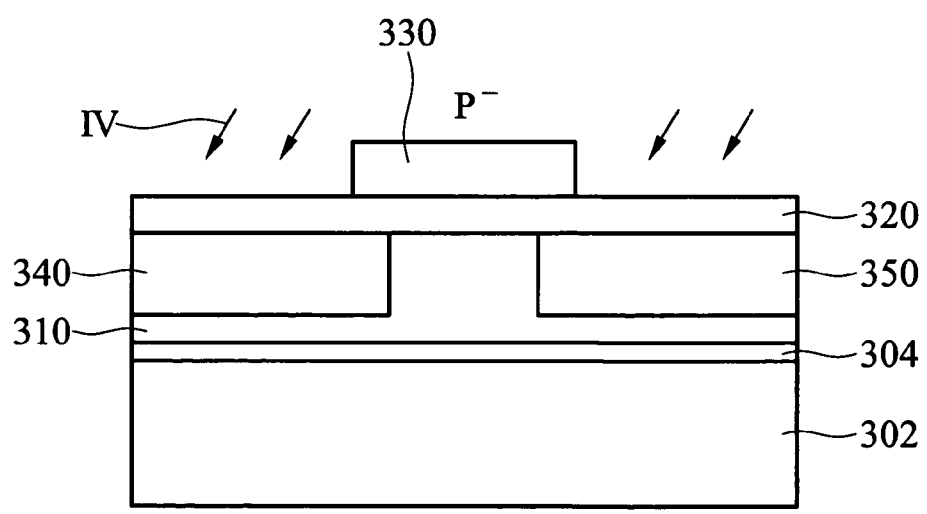

As shown in FIGS. 3B and 3C, with the gate electrode 330 serving as a mask, two tilted ion implantations are performed to implant a P-type dopant into the semiconductor layer 310 at angle III and angle IV, respectively, forming P-type lightly doped regions 340/350. The ion implantations are performed at an energy of 40 to 80 keV with a dosage of $5*10^{11}$ to $2*10^{12}$ ions/cm$^2$. The P-type dopant is implanted into the semiconductor layer 310 at angle III and angle IV deviating from a normal line of the substrate 302 by between 40 and 60°, respectively. The P-type dopant may comprise B, BH$_x$, or BF$_x$.

Figure 3D:
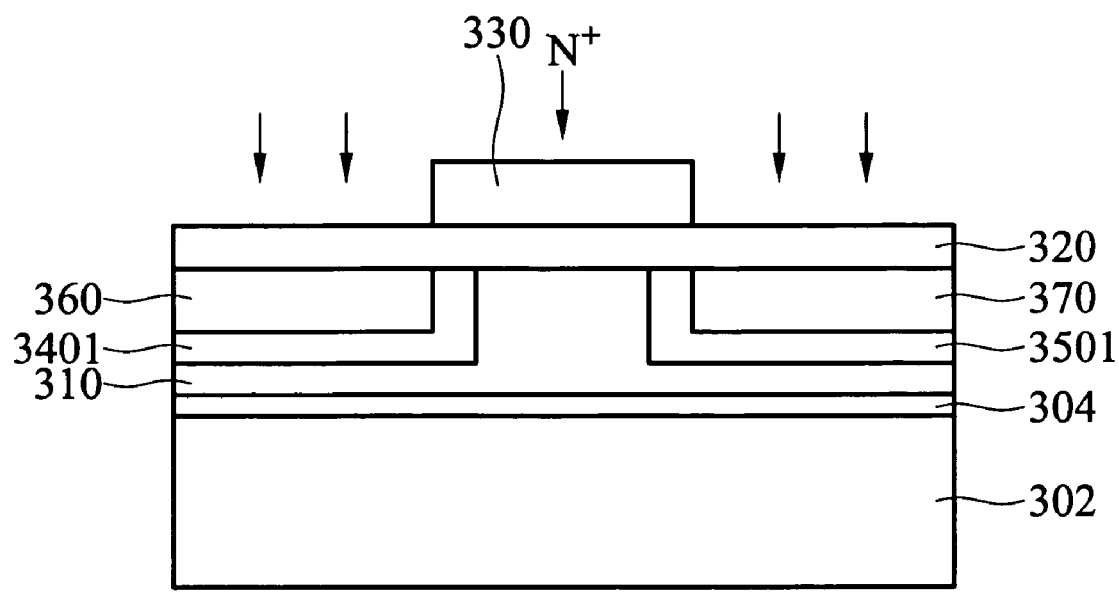

As shown in FIG. 3D, with the gate electrode 330 serving as a mask, an ion implantation is performed to implant an N-type dopant into the semiconductor layer 310, to form source/drain 360/370 regions partially overlapping the P-type lightly doped regions 340/350, respectively. In the meantime, P-type LDDs 3401/3501 are formed. The N-type dopant may comprise As, P, AsH$_x$, or PH$_x$. The N-type dopant is implanted into the semiconductor layer 310 in a direction of substantially perpendicular to the surface of the substrate 302 at an energy of 10 to 20 keV with a dosage of $1*10^{15}$ to $5*10^{15}$ ions/cm$^2$.

Figure 3E:
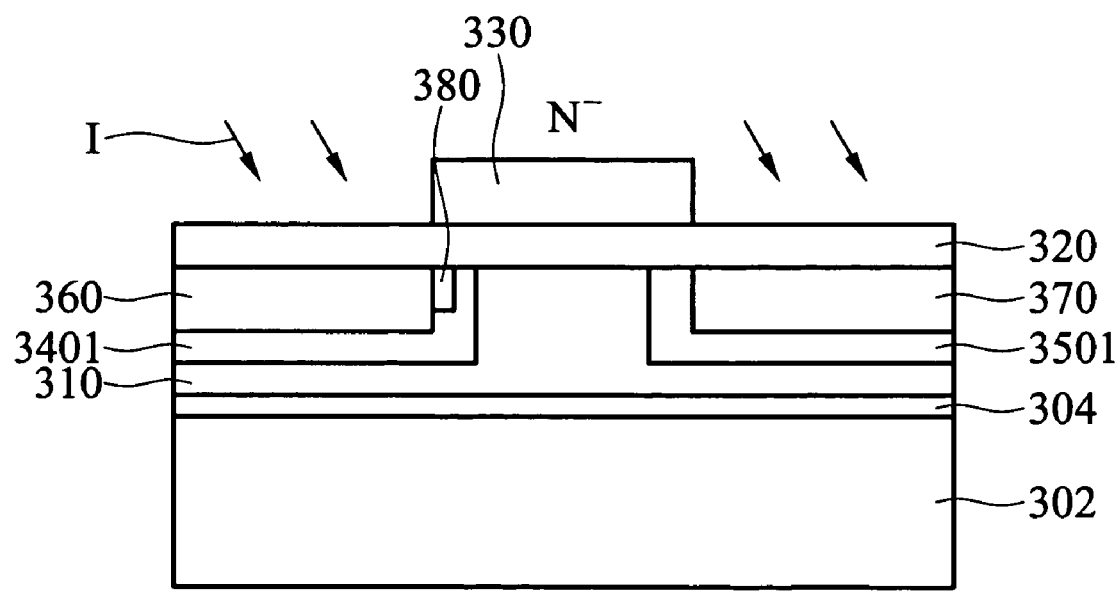
Figure 3F:
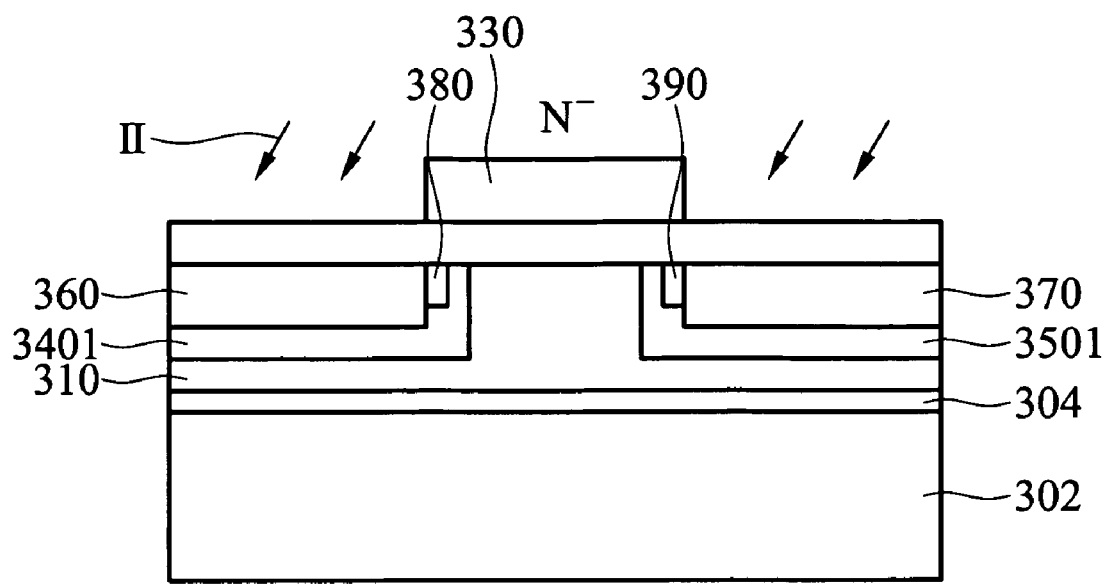

As shown in FIGS. 3E and 3F, with the gate electrode 330 serving as a mask, two tilted ion implantations are performed to implant an N-type dopant into the semiconductor layer 310 at angle I and angle II, respectively, to form N-type lightly doped regions partially overlapping the P-type lightly doped regions 340/350 and the source/drain 360/370 regions, respectively. Two N-type LDDs 380 and 390 are formed just below the gate insulating layer 320. The ion implantations are performed at an energy of 10 to 50 keV with a dosage of $5*10^{12}$ to $1*10^{14}$ ions/cm$^2$. The N-type dopant is implanted into the semiconductor layer 310 at angle I and angle II deviating from a normal line of the substrate 302 by between 40 and 80°, respectively. The N-type dopant may comprise As, P, AsH$_x$, or PH$_x$.

Figure 3G:
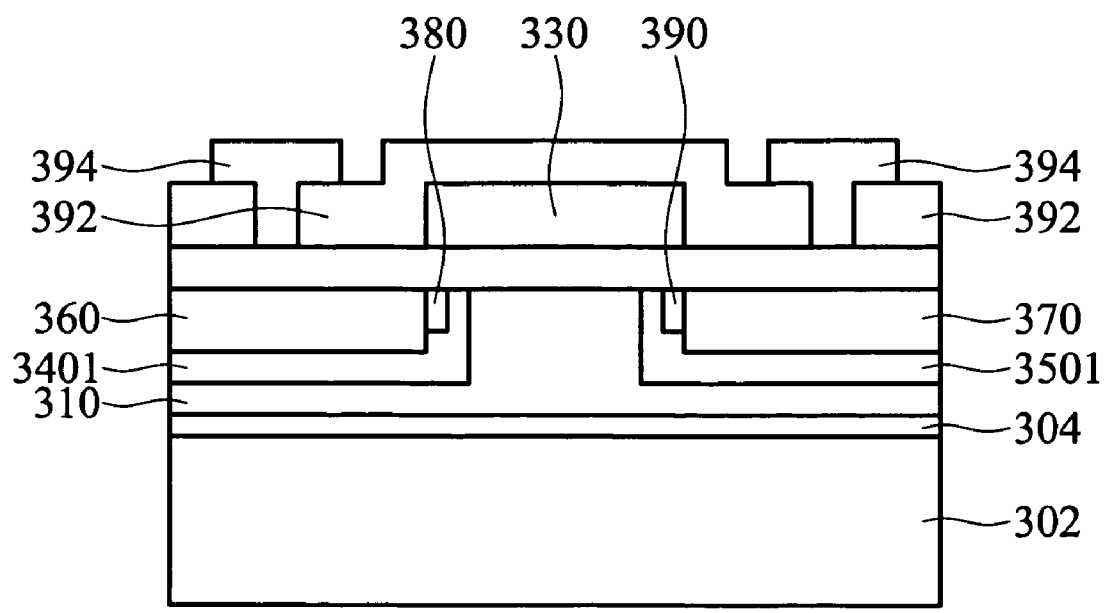

As shown in FIG. 3G, an interlayer dielectric layer 392 is formed on the gate electrode 330 and the surface of the substrate 302. A conductive line 394 is formed in the interlayer dielectric layer 392, contacting the source/drain 360/370 regions.

FIGS. 4A to 4G are cross-sections of a method of fabricating a liquid crystal display device according to an embodiment of the present invention. The method comprises the following steps.

Figure 4A:
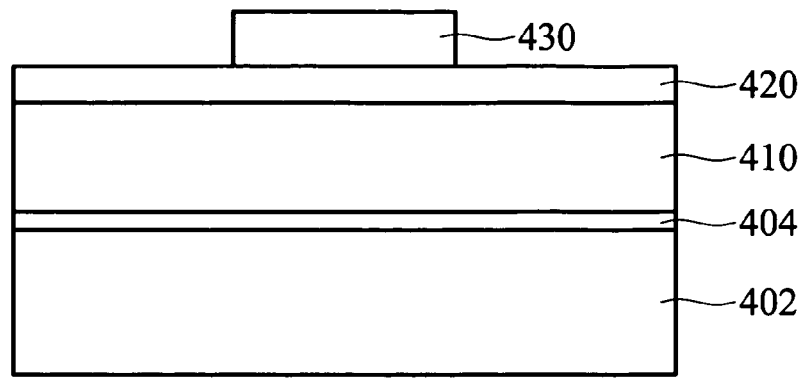
FIGS. 4A to 4G are cross-sections of a method of fabricating a liquid crystal display device having P-type LDDs according to another embodiment of the present invention.

As shown in FIG. 4A, a substrate 402 is provided followed by formation of a buffer layer 404 on the surface thereof. A semiconductor layer 410 is formed on the buffer layer 404 and a gate insulating layer 420 is formed on the semiconductor layer 410. Subsequently, a gate electrode 430 is formed on the gate insulating layer 420.

Figure 4B:
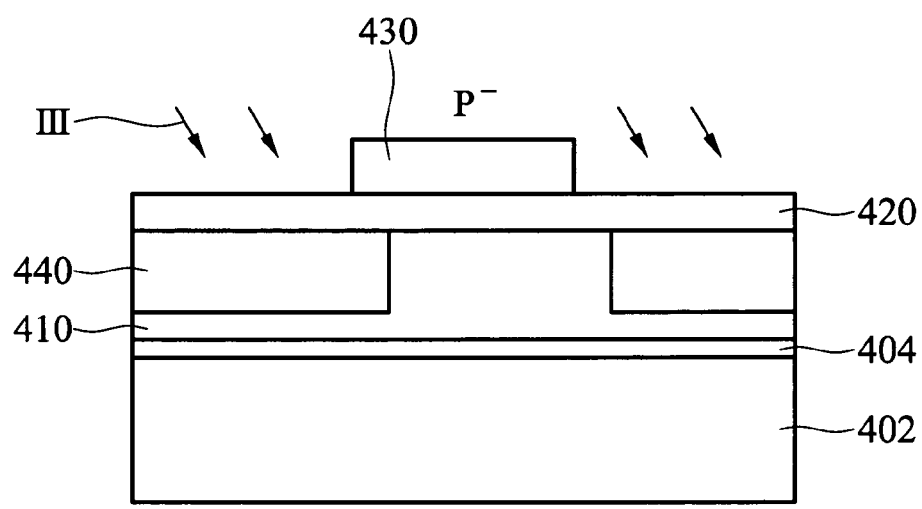
Figure 4C:
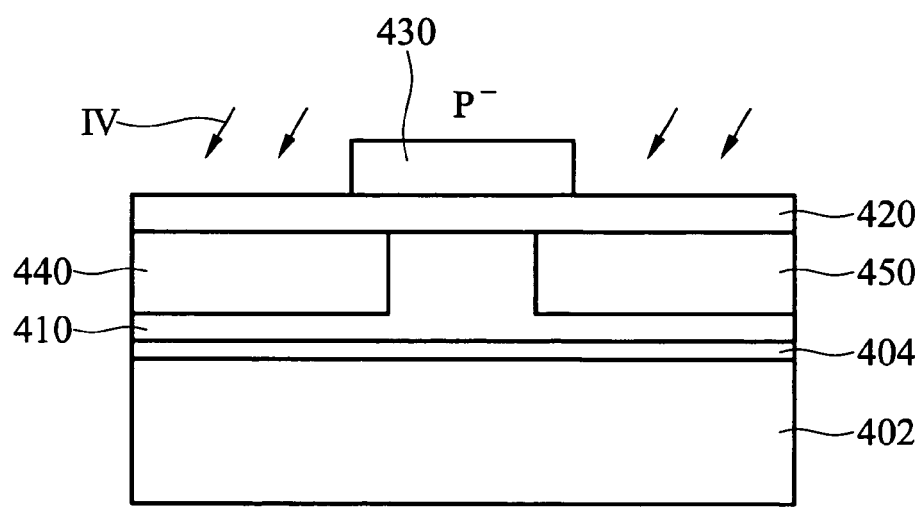

As shown in FIGS. 4B and 4C, with the gate electrode 430 serving as a mask, two tilted ion implantations are performed to implant a P-type dopant into the semiconductor layer 410 at angle III and angle IV, respectively, to form P-type lightly doped regions 440/450. The ion implantations are performed at an energy of 40 to 80 keV with a dosage of $5*10^{11}$ to $2*10^{12}$ ions/cm$^2$. The P-type dopant is implanted into the semiconductor layer 410 at angle III and angle IV deviating from a normal line of the substrate 402 by between 40 and 60°, respectively. The P-type dopant may comprise B, BH$_x$, or BF$_x$.

Figure 4D:
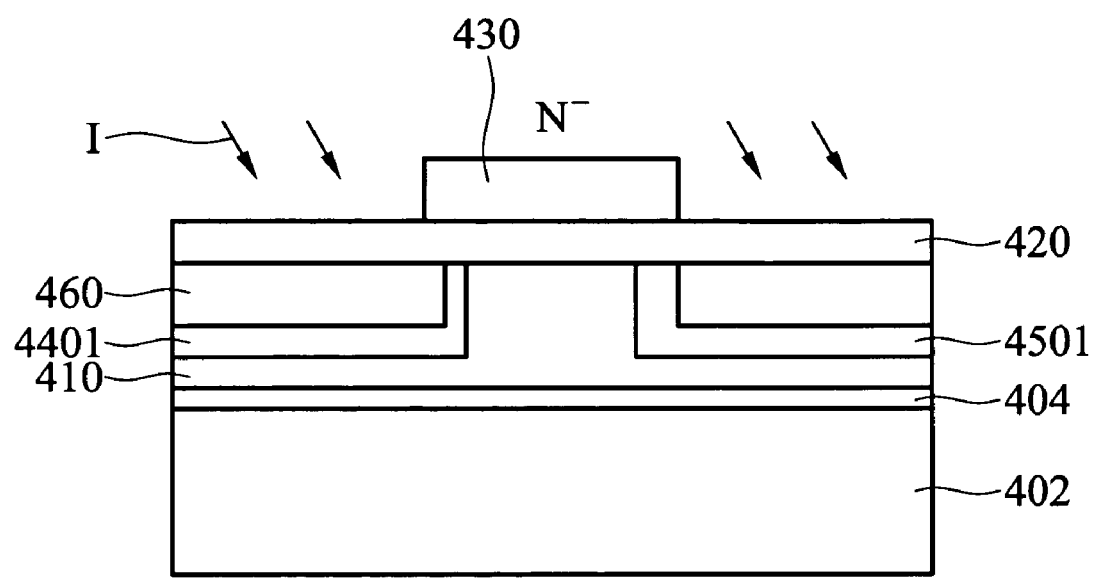
Figure 4E:
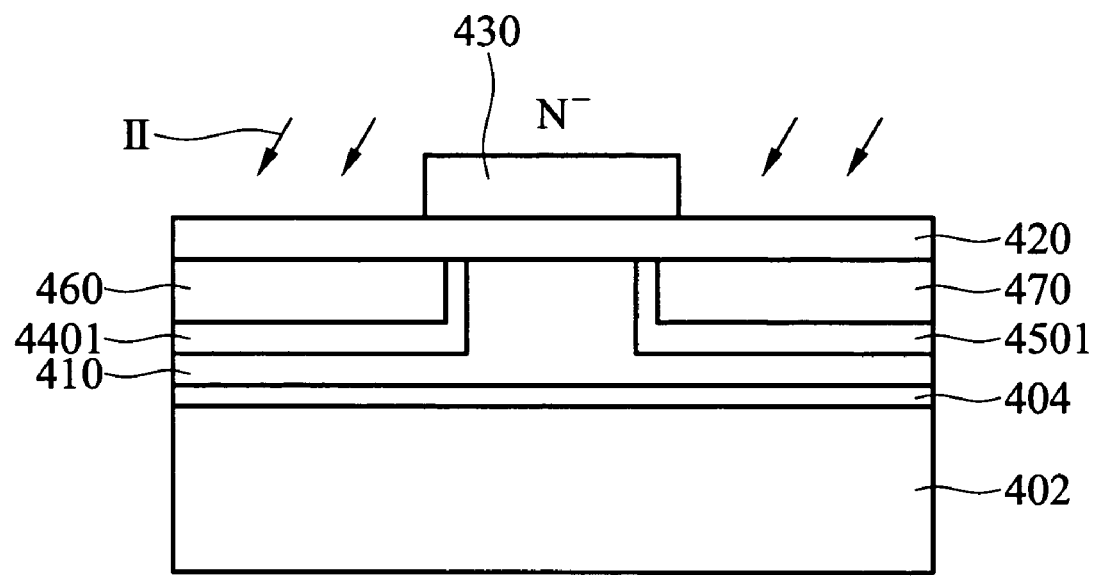

As shown in FIGS. 4D and 4E, with the gate electrode 430 serving as a mask, two tilted ion implantations are performed to implant an N-type dopant into the semiconductor layer 410 at angle I and angle II, respectively, to form N-type lightly doped regions 460 and 470 partially overlapping the P-type lightly doped regions 440 and 450. Two P-type LDDs 4401/4501 are formed. The ion implantations are performed at an energy of 10 to 50 keV with a dosage of $5*10^{12}$ to $1*10^{14}$ ions/cm$^2$. The N-type dopant is implanted into the semiconductor layer 410 at angle I and angle II deviating from a normal line of the substrate 402 by between 40 and 80°, respectively. The N-type dopants may comprise As, P, AsH$_x$, or PH$_x$.

Figure 4F:
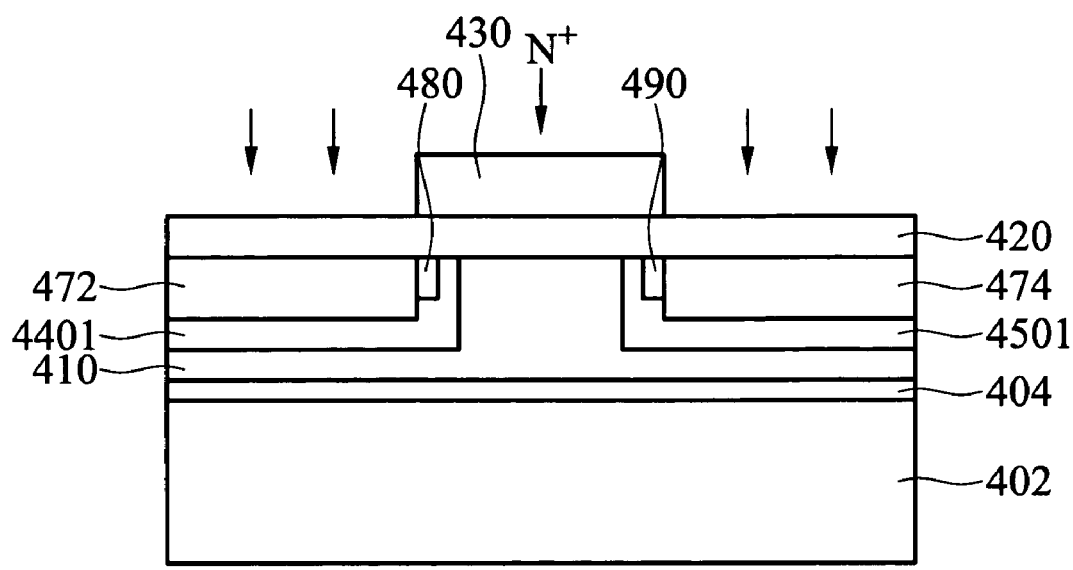

As shown in FIG. 4F, with the gate electrode 430 serving as a mask, an ion implantation is performed to implant an N-type dopant into the semiconductor layer 410, to form source/drain 472/474 regions partially overlapping the P-type lightly doped regions 440/450 and the N-type lightly doped regions 460/470. Two N-type LDDs 480 and 490 are formed just below the gate insulating layer 420. The N-type dopant may comprise As, P, AsH$_x$, or PH$_x$. The N-type dopant is implanted into the semiconductor layer 410 in a direction of substantially perpendicular to the surface of the substrate 402 at an energy of 10 to 20 keV with a dosage of $1*10^{15}$ to $5*10^{15}$ ions/cm$^2$.

Figure 4G:
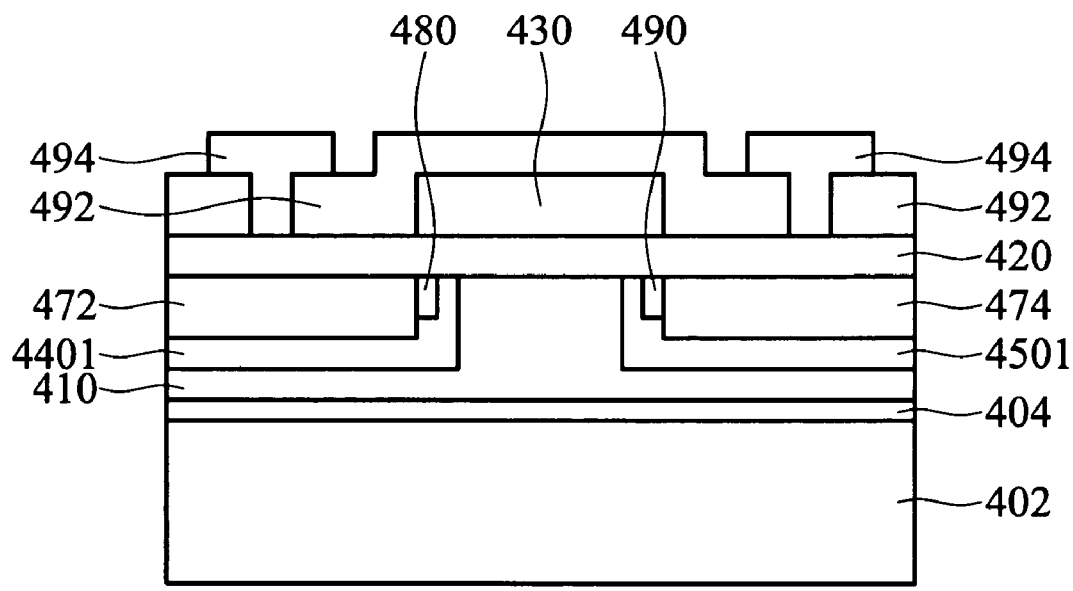

As shown in FIG. 4G, an interlayer dielectric layer 492 is formed on the gate electrode 430 and the surface of the substrate 402. A conductive line 494 is formed in the interlayer dielectric layer 492, contacting the source/drain 472/474 regions.

As shown in FIG. 1G, a liquid crystal display device according an embodiment of the invention comprises: a substrate 102; a buffer layer 104 formed on the substrate 102; a semiconductor layer 110 formed on the buffer layer 104; a gate insulating layer 120 formed on the semiconductor layer 110; a gate electrode 130 formed on the gate insulating layer 120; source/drain regions 140/150; N-type LDDs 160/161 formed in the semiconductor layer 110; P-type LDDs 165/166 formed in the semiconductor layer 110; an interlayer dielectric layer 170 covering the gate electrode 130 and the surface of the substrate 102; and a conductive line 180 formed in the interlayer dielectric layer 170; contacting the source/drain regions 140/150. The P-type LDDs 165/166 surrounds the N-type LDDs 160/161 and the source/drain regions 140/150.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A liquid crystal display device, comprising:
a substrate;
a buffer layer formed on the substrate;
a semiconductor layer formed on the buffer layer;
a gate insulating layer formed on the semiconductor layer;
a gate electrode formed on the gate insulating layer;
source/drain regions formed by implanting a first dopant into the semiconductor layer with the gate electrode serving as a mask;
a first lightly doped region formed by implanting a second dopant into the semiconductor layer with the gate electrode serving as a mask, wherein the first lightly doped region extends to a position underlying the gate electrode;
a second lightly doped region formed by implanting a third dopant into the semiconductor layer with the gate electrode serving as a mask, wherein the second lightly doped region extends to a position underlying the gate electrode;
a third lightly doped region formed by implanting a fourth dopant into the semiconductor layer with the gate electrode serving as a mask, wherein the third lightly doped region surrounds the first lightly doped region and one of the source/drain regions, and wherein the third lightly doped region extends to a position underlying the gate electrode; and
a fourth lightly doped region formed by implanting a fifth dopant into the semiconductor layer with the gate electrode serving as a mask, wherein the fourth lightly doped region surrounds the second lightly doped region and one of the source/drain regions, and wherein the fourth lightly doped region extends to a position underlying the gate electrode.

2. The device as claimed in claim 1, wherein the source/drain regions partially overlap the first lightly doped region and the second lightly doped region, respectively.

3. The device as claimed in claim 2, wherein the source/drain regions are formed by implanting the first dopant into the semiconductor layer substantially perpendicular to a surface of the substrate.

4. The device as claimed in claim 1, wherein the first dopant, the second dopant, and the third dopant are As, P, $AsH_x$, or $PH_x$.

5. The device as claimed in claim 1, wherein the fourth dopant and the fifth dopant are B, $BH_x$, or $BF_x$.

6. The device as claimed in claim 1, further comprising:
an interlayer dielectric layer covering the gate electrode and the surface of the substrate; and
a conductive line formed in the interlayer dielectric layer, contacting the source/drain regions.

* * * * *